(12) United States Patent  (10) Patent No.: US 7,533,193 B2
Testin et al.  (45) Date of Patent: May 12, 2009

(54) APPARATUS AND METHOD FOR REDUCING ELECTROMIGRATION

(75) Inventors: William John Testin, Indianapolis, IN (US); Dale Wayne King, Noblesville, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 698 days.

(21) Appl. No.: 10/296,881

(22) PCT Filed: May 24, 2001

(86) PCT No.: PCT/US01/16953

§ 371 (c)(1),
(2), (4) Date: Nov. 27, 2002

(87) PCT Pub. No.: WO01/95499

PCT Pub. Date: Dec. 13, 2001

(65) Prior Publication Data

US 2004/0012492 A1  Jan. 22, 2004

Related U.S. Application Data

(60) Provisional application No. 60/208,750, filed on Jun. 2, 2000.

(51) Int. Cl.
*G06F 3/00* (2006.01)

(52) U.S. Cl. .............................. 710/8; 710/12; 710/14; 710/15; 710/18; 257/767

(58) Field of Classification Search ................ 710/8, 710/12, 14–15, 18; 257/767
See application file for complete search history.

(56) References Cited

U.S. PATENT DOCUMENTS

| | | | |
|---|---|---|---|
| 3,987,380 A | 10/1976 | Hudson, Jr. | 333/79 |
| 4,330,637 A | 5/1982 | Wong | 524/720 |
| 4,640,746 A | 2/1987 | Nobel et al. | 204/15 |

(Continued)

FOREIGN PATENT DOCUMENTS

| | | | |
|---|---|---|---|
| DE | 19522156 | | 8/1996 |
| EP | 427364 | * | 5/1991 |
| EP | 709961 | | 5/1996 |

OTHER PUBLICATIONS

"Design Guidelines", Apr. 20, 2000, http://web.archive.org/web/20000420043129/http://www.filtranmicro.com/.*

(Continued)

*Primary Examiner*—Alford W Kindred
*Assistant Examiner*—Chun-Kuan Lee
(74) *Attorney, Agent, or Firm*—Robert D. Shedd; Jospeh J. Opalach; Reitseng Lin

(57) ABSTRACT

An apparatus and method therefor wherein instead of applying a high bias voltage 100 per cent of the time to leads susceptible to dendrite formation, the bias voltage is switched from a low bias voltage to a high voltage bias mode when the leads (19) are to be read or scanned by a microprocessor (14), and the bias voltage is then switched back to a low bias voltage mode when the lines are not being read, e.g., at other times, thereby greatly reducing the high bias "on" time and dramatically reducing the probability of dendrite formation. The reduction of high bias voltage "on" time is accomplished by programming the microprocessor (14) to switch the applicable input ports (16) to be output ports when the leads (19) are not to be read. As output ports, the output impedance and output voltage of the microprocessor are low as opposed to a high input impedance when the terminals are input terminals. When the leads are configured as output leads, the voltage division of the microprocessor low output impedance, in combination with a large valued pull-up resistor (12) which provides the high bias voltage when the leads are input leads, makes the voltage bias on the leads low, thus greatly reducing the probability of dendrite formation.

11 Claims, 2 Drawing Sheets

U.S. PATENT DOCUMENTS

| | | | |
|---|---|---|---|
| 4,749,626 A | 6/1988 | Kadija et al. | 428/647 |
| 4,862,166 A * | 8/1989 | Yamakawa | 341/22 |
| 5,185,567 A | 2/1993 | Uchida | 323/267 |
| 5,263,171 A * | 11/1993 | Asprey | 710/240 |
| 5,386,584 A * | 1/1995 | Verstegen et al. | 710/59 |
| 5,872,512 A | 2/1999 | Kackman et al. | 340/507 |
| 6,066,197 A * | 5/2000 | Bristol et al. | 106/14.42 |
| 6,126,806 A | 10/2000 | Uzoh | 205/182 |
| 6,225,825 B1 * | 5/2001 | Hopsecger | 326/82 |

OTHER PUBLICATIONS

"Interfacing MC68HC05 Microcontrollers to the IBM AT Keyboard Interface", 1997.*

"ST10R167—16 bit ROMLESS MCU", Aug. 1999.*

* cited by examiner

APPARATUS AND METHOD FOR REDUCING ELECTROMIGRATION

This application claims the benefit under 35 U.S.C. § 365 of International Application PCT/US01/16953, filed May. 24, 2001, which was published in accordance with PCT Article 21(2) on Dec. 13, 2001 in English; and which claims benefit of U.S. Provisional Application Ser. No. 60/208,750 filed Jun. 2, 2000.

BACKGROUND

Dendrites, also known as whiskers, are microscopic crystalline metallic filaments that grow outwardly in various directions from solder, copper and other similarly susceptible metals. The dendrites have the appearance of very fine hairs which can bridge adjacent parts or conductors, e.g., on a printed circuit board surface between two traces, or between two solder joints, which in both cases have a voltage potential between them. The dendrite formation caused by these metallic dendritic bridges develops over a period of time and may eventually extend between the printed circuit board traces, particularly if the traces are close to each other and/or are unplated copper, because copper is a particularly susceptible metal well known for having electromigration problems. The dendrites can also form between component solder joints which may or may not be on a printed circuit board. This had proved to be a problem in early telephones where the dendrites between components traversed non-trivial distances.

Dendrites are electrically conductive, and when extending from point to point, form an electrical short circuit or on rare occasions, a parasitic resistance. The dendrite structures are caused by electromigration which in turn is caused by a voltage difference acting, e.g., on surface contaminants such as a residue of an acid based solder flux present on a printed circuit board. The problem is exacerbated by the presence of moisture, by a DC bias voltage of greater than about 2.0 volts between the two affected portions, and/or by close proximity bare copper printed circuit board traces. For example, the bias voltage provides a potential that motivates tin particles of the solder to migrate from the positive potential to the negative potential. The short circuit thus produced eliminates the electromigration field generated by the bias voltage.

In a signal processing system having a microprocessor, such as a television receiver, VCR, DVD player or the like, bias is provided by the normal connection of a matrix keyboard, which, e.g., puts a 5.0 volt DC potential via a pull-up resistor between one contact on a momentary contact switch and ground. The problem is exacerbated by the use of "spark gaps" between contacts on the keyboard and ground. In order to protect the input circuitry of the microprocessor from damage caused by electrostatic discharges, such spark gaps, which are two closely spaced bare copper pads with the solder resist removed between the pads, will "fire" at about 2 KV. This area, without solder resist and with a constant bias voltage applied to the keyboard, in combination with residual flux, makes it a prime location for the forming of dendrites. Dendrite formation is also a problem for any closely spaced traces on a printed circuit board, e.g., solder coated closely spaced leads of an integrated circuit.

Accordingly, it is desirable to reduce dendrite formation. An example of measures taken to reduce dendrite formation in the prior art is shown in U.S. Pat. No. 5,872,512 of Kackman et al.

SUMMARY OF THE INVENTION

An apparatus and method therefor wherein instead of applying a high bias voltage 100 per cent of the time to leads susceptible to dendrite formation, the bias voltage is switched from a low bias voltage to a high voltage bias mode when the leads are to be read or scanned by a microprocessor, and the bias voltage is then switched back to a low bias voltage mode when the lines are not being read, e.g., at other times, thereby greatly reducing the high bias "on" time and dramatically reducing the probability of dendrite formation.

The reduction of high bias voltage "on" time is accomplished by programming the microprocessor to switch the applicable input ports to be output ports when the leads are not to be read. As output ports, the output impedance and output voltage of the microprocessor are low as opposed to a high input impedance when the terminals are input terminals. When the leads are configured as output leads, the voltage division of the microprocessor low output impedance, in combination with a large valued pull-up resistor which provides the high bias voltage when the leads are input leads, makes the voltage bias on the leads low, thus greatly reducing the probability of dendrite formation.

BRIEF DESCRIPTION OF THE DRAWINGS

Referring now to the drawings wherein.

DETAILED DESCRIPTION OF THE PREFERRED EMBODIMENT(S)

Figure 1:
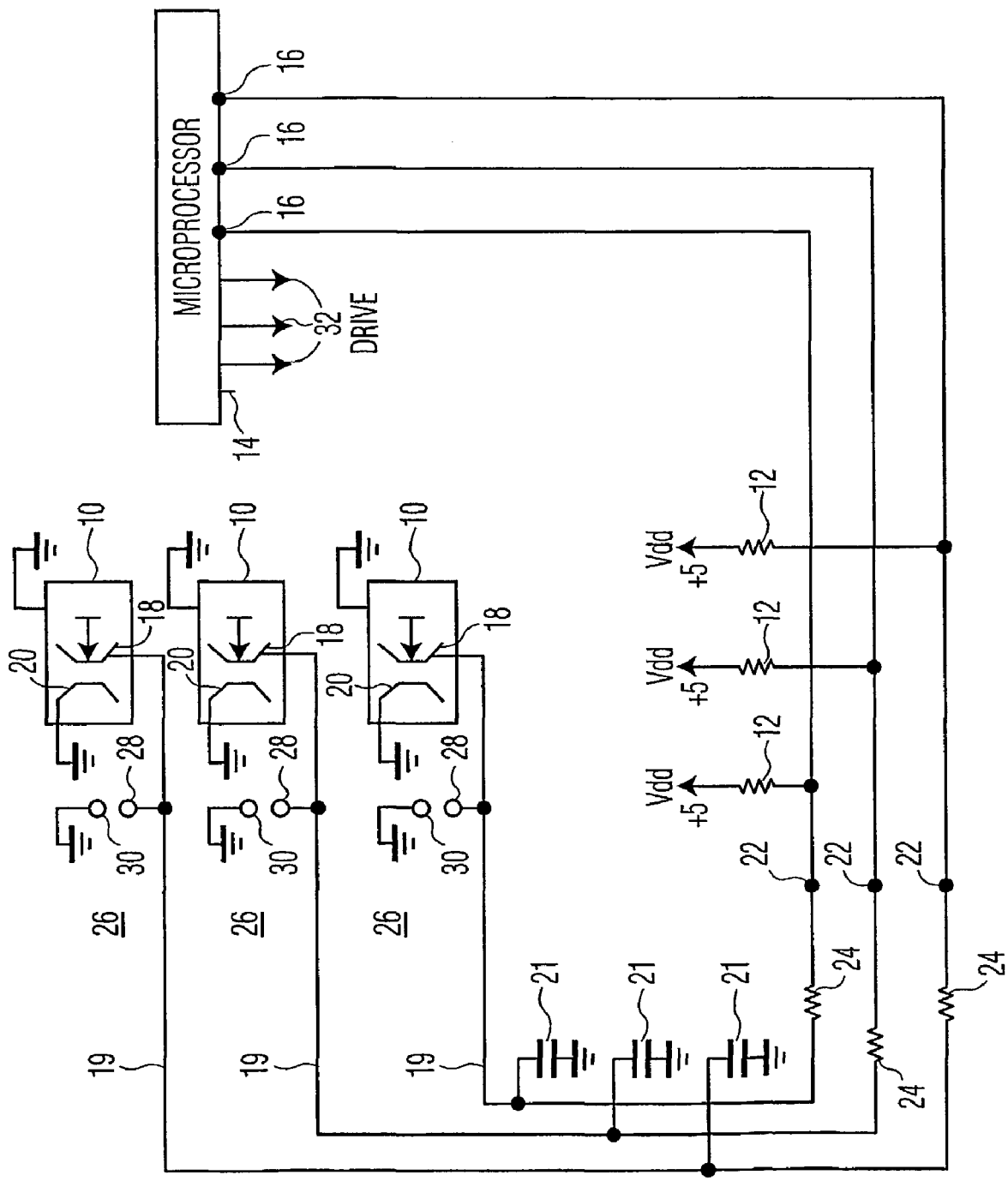
FIG. 1 is a schematic of pertinent portions of a representation of keyboard switches with pull-up resistors, and a representation of a programmable microprocessor with input terminals.

Referring now to FIG. 1, there is shown a schematic of representative pertinent portions of keyboard switches 10 with respective pull-up resistors 12, and a programmable microprocessor 14 having appropriate ROM, RAM and CPU (not shown), with programmable input/output (I/O) terminals 16 coupled to respective switches 10. The microprocessor of the exemplary embodiment is an ST92196 manufactured by STMicroelectronics Co. and, as is common for such microprocessors, can be programmed for individual I/O terminals 16 to be, inter alia, input terminals or output terminals, in a high or low state. A two hundred page data sheet is available from the manufacturer, to enable those skilled in the art, to circuit design with and program the microprocessor.

Switches 10 include a printed circuit trace and respective movable contact 18 which is movable into electrical contact with a grounded stationary contact and respective printed circuit trace 20 when a key of a keyboard or keypad (not shown) is physically depressed/pushed by a user. When contact 18 is depressed, it is brought into electrical contact with respective ground terminal 20, as is respective lead/node 19. Printed circuit traces 18 and 20 are in close proximity to each other on the printed circuit board since connection is made to both of them by the same key, and thus printed circuit contact points 18, 20 are prime locations susceptible to dendrite formation. When electrical contact is made between contact points 18, 20, respective nodes 22, coupled to respective nodes 19 through respective resistors 24, are coupled to the microprocessor input terminals 16. Thus, node 22 is changed from being at a pull-up voltage, which in this case is +5.0 volts, to a lower voltage determined by the voltage division at the junction of respective resistors 12 and 24. This switching to a voltage lower than the pull-up voltage signals to microprocessor 14, that the particular key has been actuated. Programming for recognizing such actuation, and the programming of microprocessors for scanning matrix keyboards, is old in the art, as shown by U.S. Pat. No. 5,381,142 of Simmons, Jr., of an antecessor common assignee.

Additionally, leads/nodes 19 and terminals 16 are protected from static electricity overvoltage conditions by respective spark gaps 26 which include a terminal 28 connected to node 19, and a ground terminal 30. Such spark gaps are two closely spaced printed circuit pads on a printed circuit board (not shown) which have the solder resist removed between the pads, and which will arc at about 2 KV of static electricity occurring between the pads. This area is a printed circuit trace of bare copper without solder resist, protective metallic plating or other protective metallic coating, and with a bias derived from Vdd through series resistors 12 and 24, in combination with residual flux or other impurities on the printed circuit board, also make the spark gaps a prime location for dendrite formation.

According to aspects of the present invention, since the keyboard switches 10 are not read most of the time, a reduction of the voltage at node 19 during the non-reading inactive time would greatly reduce the probability of dendrite formation. Thus, the high voltage, i.e., 5.0 volts, is coupled to nodes 19, 22 and terminals 18 when the keyboard is being scanned to determine actuation, and at other times, such high voltage is not necessary, a low voltage between respective contacts 18, 20 and 28, 30 is provided in a manner discussed below.

During non-scanning periods, the voltage at nodes 19, 22 is reduced to a low voltage in order to reduce the probability of dendrite formation. This is accomplished by programming microprocessor 14 to make terminals 16, which as input terminals have a high input impedance of more than 5 megohm when writing to the data direction register, to be output terminals 16 which have a low output impedance in the push-pull output mode of 1 Kohm for a logic one state, and 250 ohms in logic zero state. When terminals 16 are in such low output impedance mode, the voltage at nodes 19, 22 is the voltage division of pull-up resistors 12 of 100 Kohm to 200 Kohm and the respective output impedance of microprocessor 14. Thus, the voltage between terminals 18, 20 and 28, 30 is about 50 to 100 millivolts, and the probability of dendrite formation is greatly reduced regardless of which logic state of output terminal is used. It should be noted that the values of pull-up resistors 12 can be made larger so that if the device is battery powered, e.g., a remote control, the current drain through resistors 12 when the leads 19 are in a low bias voltage mode will be small compared with the rest of the load on the battery. Additionally, although pull-up resistors 12 are shown herein to be external of microprocessor 14, many such microprocessors have internal pull-up resistors.

In addition to the spark gap overvoltage protection discussed above, 1000 pf capacitors 21 are coupled between respective nodes 19 and ground in order to help absorb static electricity discharges which might appear at the node. These capacitors, in combination with resistors 24, help protect the input terminals of microprocessor 14 from damage by such static electricity discharges.

It should be noted that the present invention is equally applicable if logic levels are reversed, i.e., pull-up resistors are changed to pull-down resistors, or if negative bias voltages are applied to the keyboard leads. In such a case, the electromigration would be from the reference potential to the lead instead of from the lead to the reference potential. What counts is the absolute value of the DC potential between the leads, not the polarity of the DC potential.

Thus, when keys 10 are to be scanned, terminals 16 are configured from being output terminals to being input terminals which have a higher input impedance, and thus, the high 5.0 volt bias on leads/nodes 19 is re-established. A flow chart of the programming of microprocessor 14 for providing the scanning and non-scanning time, and changing the configuration of terminals 16, between input terminals and output terminals, is shown in FIG. 2.

Figure 2:
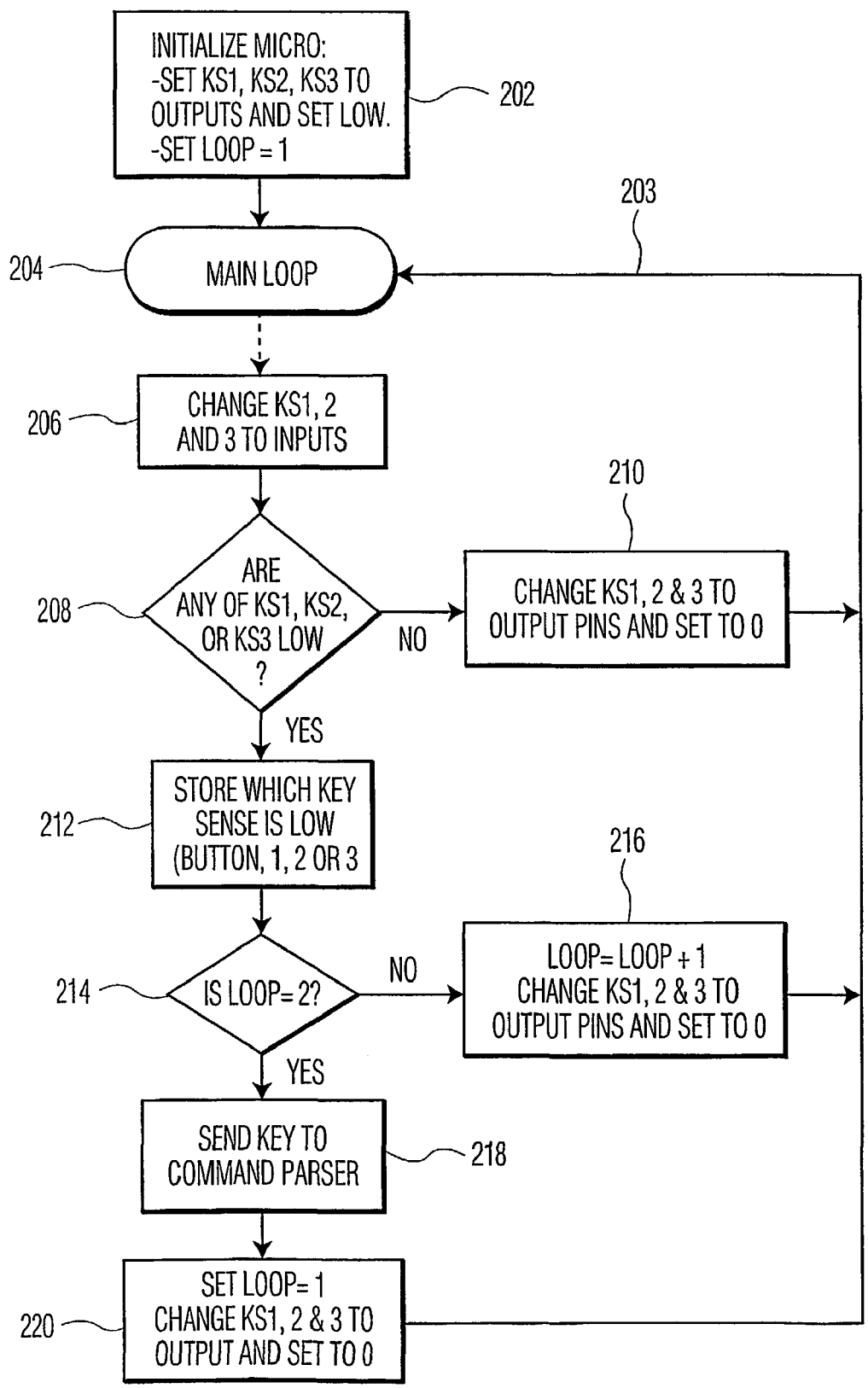
FIG. 2 is a flow chart of the microprocessor program for switching the pertinent terminals between being input ports and output ports, and for programming the microprocessor to switch between scan and non-scan modes.

Referring now to the flow chart of FIG. 2, KS numbers are switch sense lines of microprocessor 14, and the button numbers are various user accessible buttons assigned to respective switch sense lines. As used in the flow chart and the discussion therewith, the term "low" for a sensed line means lower than the full pull-up voltage. Thus, with a switch contact grounded, the voltage at the microprocessor terminal is the voltage division at the junction of resistors 12 and 24 (node 22) and the particular lead is sensed as being low, i.e., that the associated key has been pressed thereby grounding the respective node 19. This "low" is different from the various lines being placed in a "low" state by the programming of microprocessor 14.

At 202 the program is initialized by setting the KS sense lines to be outputs at a logic state of zero, and the loop is set to equal one. This is consistent with the sense lines being in a low output terminal state when the sense lines are not being read, so that the probability of dendrite formation is reduced.

In preparation for reading the input sense lines, the sense lines are set to be input terminals at 206. A reading is made at 208 and a decision is made depending upon the voltage of the sensed lines, i.e., if any of the sense lines are sensed to be at a low voltage, this would indicate that one of the keys are being pressed. If none of the sense lines are sensed to be at a low voltage, then the answer is "no", and the sense lines are changed to be in an output state set to zero logic level at 210 because, according to aspects of the present invention, the sense lines are outputs and in a low state except during the read process, and the loop is returned via 203 to the main loop 204. If the answer at 208 is yes, meaning a key/button had been pressed, which key/button is sensed as low is stored in a memory register at 212, such memory register being a programmed part of microprocessor 14.

It should be noted that switches having different logic arrangements can be used. For example, sense lines can be switched to drive lines 32 instead of to ground (not shown), with the drive lines and associated sense lines being similarly programmable to be in high/low input/output states. Such lines can also be susceptible to dendrite formation and thus, the present invention is applicable thereto. In such an event, the flow chart can be changed according to aspects of the present invention, and additional memory registers 212 can be programmed for sensing the actuation of each type of differing logic switches.

The output from register(s) 212 is fed for decision at 214 where it is determined whether or not the loop equals two. This is done because the loop starts out equal to 1 at 202, and for every iteration of a single sensed keypress, the loop number is incremented by one at 216. If the loop equals two, which means it has traversed the loop twice, there is some assurance that the command is not generated by switch bounce, because the main loop takes about 20 milliseconds per iteration, which is sufficient time to debounce the buttons. If the answer is "no", then there is a second go around by loop 203 with the loop number being incremented by plus 1, and the sense lines are re-initialized to be a outputs set to a logic zero state at 219. If the answer is "yes", then the command is sent to a command parser (not shown) of microprocessor 14 at 220 for execution of the command, based upon a look-up table (not shown). Once the command is executed, the loop is reset to one, and the sense lines are reset to output and a logic zero state at 222 so that the sense lines are outputs and set to logic low except during the read process. The loop starts over again by feedback loop 203 to main loop 204 looking for a new occurrence of a keypress.

As discussed herein the leads susceptible to dendrite formation are on a printed circuit board. However, it is within the contemplation of the present invention that the dendrite formation susceptible leads or solder joints can also be disposed on components not on a printed circuit board.

As used herein, the terms keyboard or keys include remote control buttons, or user accessible buttons on a chassis or cabinet.

The invention claimed is:

1. An apparatus, comprising:
   a microprocessor having a plurality of programmable input/output terminals; and
   a plurality of leads including at least three leads, each of the plurality of leads coupled to a different key of a keyboard, each of the plurality of programmable input/output terminals coupled to only one of the plurality of leads regardless of an actuation state of the keys;
   wherein the microprocessor reduces electromigration by performing steps comprising:
   (a) configuring the plurality of leads to be input leads by simultaneously applying a first voltage to each of the plurality of leads;
   (b) detecting whether an input signal is present at one of the plurality of leads while the plurality of leads are configured as the input leads;
   (c) when the input signal is present while the plurality of leads are configured as the input leads, storing an identification corresponding to the detected input signal for the one of the plurality of leads and then configuring the plurality of leads to be output leads by simultaneously applying a second voltage to each of the plurality of leads, wherein the second voltage is different from the first voltage;
   (d) when the input signal is not present at the one of the plurality of leads while the plurality of leads are configured as the input leads, configuring the plurality of leads to be the output leads by simultaneously applying the second voltage to each of the plurality of leads; and
   sequentially repeating steps (a) through (d) until the input signal is present at the one of the plurality of leads.

2. The apparatus of claim 1, wherein the input signal is a predefined signal.

3. The apparatus of claim 1,
   wherein when the microprocessor configures the plurality of leads to be the output leads, the microprocessor simultaneously applies a signal representing a logic zero to each of the plurality of leads.

4. The apparatus of claim 1, wherein each of the plurality of leads is susceptible to dendrite formation and is disposed on a printed circuit board.

5. The apparatus of claim 4, wherein each of the plurality of leads comprises a printed circuit board trace of bare copper.

6. The apparatus of claim 1, wherein each of the plurality of leads is susceptible to dendrite formation and is a solder joint of an electrical component.

7. The apparatus of claim 6, wherein the electrical component is mounted on a printed circuit board.

8. The apparatus of claim 1,
   wherein when the microprocessor configures the plurality of leads as the output leads, the microprocessor simultaneously applies a first impedance to each of the plurality of leads, and when the microprocessor configures the plurality of leads as the input leads, the microprocessor simultaneously applies a second impedance to each of the plurality of leads, wherein the first impedance is lower than the second impedance.

9. The apparatus of claim 1,
   wherein when the microprocessor configures the plurality of leads as the input leads, the microprocessor simultaneously applies a signal representing a logic one to each of the plurality of leads.

10. The apparatus of claim 1,
    wherein when the microprocessor detects the input signal is present at the one of the plurality of leads, the microprocessor identifies a key corresponding to the stored identification.

11. The apparatus of claim 1,
    wherein when the microprocessor detects the input signal is present at the one of the plurality of leads, the microprocessor executes a command responsive to the input signal.

* * * * *